United States Patent [19]
Noxon et al.

[11] Patent Number: 5,923,629
[45] Date of Patent: Jul. 13, 1999

[54] MAGNETIC RECORDING ENCODER SYSTEM FOR A (1,7) CHANNEL HAVING A ⅔ CODING RATE

[75] Inventors: James E. Noxon, Morrison; Toan Q. Doan, Lafayette; Paul Jay Hogan, Boulder, all of Colo.

[73] Assignee: Caleb Technology Corporation, Boulder, Colo.

[21] Appl. No.: 08/965,112

[22] Filed: Nov. 6, 1997

[51] Int. Cl.⁶ .................................................... G11B 7/00

[52] U.S. Cl. .................................... 369/59; 369/47; 360/48

[58] Field of Search .................................... 369/59, 42, 48, 369/49, 50, 54, 58, 124; 360/48, 49, 53, 39; 341/50, 59

[56] References Cited

U.S. PATENT DOCUMENTS 4,413,251 11/1983 Adler et al. .
5,761,170 6/1998 Kimura et al. ............................ 369/59

*Primary Examiner*—Muhammad Edun
*Attorney, Agent, or Firm*—Emery L. Tracy; Christopher J. Kulish

[57] ABSTRACT

An improvement in a system for encoding a data field on a disk with write gate data. The system has an encoder and a data receiving controller for directing write gate data in the form of 0 and 1 bits to the encoder. The encoder, in response to the write gate data, produces a primary code in the form of 0 and 1 bits and directing the primary code to the disk. The primary code has certain predetermined criteria with the encoder producing a secondary coding rate as an exception when the write gate data does not result in the predetermined criteria. The improvement comprises a mechanism for ensuring that the last predetermined number of bits in the data field are free from the exception.

14 Claims, 2 Drawing Sheets

| UNCONSTRAINED 2 BIT DATA PAIRS | CONTRAINED 3 BIT DATA WORDS |
|---|---|
| 0 0 | 0 0 1 |
| 0 1 | 0 1 0 |
| 1 0 | 1 0 0 |
| 1 1 | 1 0 1 |

PRIMARY LOOKUP TABLE

| UNCONSTRAINED 2 BIT DATA PAIRS THAT CAUSE VIOLATIONS | CONSTRAINED 6 BIT DATA WORDS THAT VIOLATE CONSTRAINT | CONSTRAINED 6 BIT DATA WORDS THAT CORRECT VIOLATIONS |
|---|---|---|
| 0 0 1 0 | 0 0 1 1 0 0 | 0 0 1 0 0 0 |
| 0 0 1 1 | 0 0 1 1 0 1 | 0 1 0 0 0 0 |
| 1 1 1 0 | 1 0 1 1 0 0 | 1 0 1 0 0 0 |
| 1 1 1 1 | 1 0 1 1 0 1 | 1 0 0 0 0 0 |

SECONDARY LOOKUP TABLE

| UNCONSTRAINED DATA | 0 0 | 0 1 | 1 0 | 1 1 | 1 0 | 1 0 | 0 0 | 1 0 | 0 1 |
|---|---|---|---|---|---|---|---|---|---|
| CONSTRAINED DATA | 001 | 010 | 100 | 101 | 000 | 100 | 010 | 000 | 010 |
| GENERATING TABLE | P.T. | P.T. | P.T. | S.T. | | P.T. | S.T. | | P.T. |

SAMPLE ENCODING

MAGNETIC RECORDING ENCODER SYSTEM FOR A (1,7) CHANNEL HAVING A ⅔ CODING RATE

BACKGROUND OF THE INVENTION

1. Field of the Invention

This invention relates generally to a magnetic recording encoder system for a (1,7) channel having a ⅔ coding rate for encoding data in preparation for writing said data on a disk during a write gate signal being active and, more particularly, it relates to a magnetic encoder system for a (1,7) channel having a ⅔ coding rate for encoding data in preparation for writing said data on a disk during a write gate signal being active with a mechanism for ensuring that data during the training and write pad portions of the written data field qualify as valid data for those fields irrespective of the data being presented to the encoder.

2. Description of the Prior Art

When data is written on a disk, there must be a way to read the data back from the disk in order to synchronize the data to a clock thereby clocking the data back in the shift register. Basically, the data must be encoded as the data is written to the disk in such a fashion to guarantee that the data information will be readable from the disk over time. The length of time is limited so that every time a new piece of data information is read, the clock can be synchronized.

Various ways have been proposed in the past for increasing the recorded data density on mediums such as magnetic discs or tapes and in other similar media. One approach utilized is known as run-length-limited (RLL) coding which requires that each 1 in a coded bit sequence must be separated from the nearest adjacent 1 by a specified number of 0's. This number must be at least equal to a minimum quantity d because of inter-symbol interference but must not exceed a maximum of k which is required for self-clocking purposes. Codes following this RLL format are generally referred to as (d,k) run-length-limited codes. The present invention relates to a particular code suited for magnetic recording channels wherein d=1 and k=7. To convert unconstrained data into a (d,k)-constrained format generally requires that m unconstrained bits be mapped into n constrained bits, where m<n. The ratio m/n is usually referred to as the coding rate or efficiency. It is obviously desirable to maximized this coding rate. The tradeoffs usually considered in maximizing the rate are the decoding look-ahead and the hardware complexity.

Raising the coding efficiency or rate at the expense of decoding look-ahead generally results in increasing the error propagation on data read back. That is, a single bit error introduced in the code stream will cause a certain number of subsequent bits to also be erroneous before the coding algorithm becomes self-correcting. It is always desirable to minimize error propagation. To this end, it has been found that a coding rate of ⅔ is optimal for the (1,7) code.

In the Adler et al, U.S. Pat. No. 4,413,251, an algorithm and hardware for producing a RLL code for magnetic recording channels is described. The system of the Adler et al patent produces sequences which have minimum of one 0 and a maximum of seven 0's between adjacent 1's. The code is generated by a sequential scheme that maps two bits of unconstrained data into three bits of constrained data. The encoder is a finite state machine whose internal state description requires three bits. The decoder requires a look-ahead of two future symbols (six bits) and its operation is chapel state independent.

While the hardware implementation of the system of the Adler et al patent is simple and can operate at very high data speeds, the Adler et al patent's system (and others like it) are generic and require knowledge within the controlling entity (controller) of the encoders encoding mechanism. Further, buffer space must be provided in the controller for the information written in the training and write pad fields. For instance, when writing the training field, data must be presented to the encoder which generates a known encoded symbol for proper symbol boundary alignment during readback. Further, when writing the write pad field, data must be presented to the encoder which will guarantee all encoder exception processing is completed before the end of the write pad field. Both situations require knowledge of the encoders encoding mechanism if proper data is to be presented by the controller. In the latter situation, if all exception processing has not been completed at the end of the write gate signal being active then there exists a possible failure mode during read back. The decoder would require additional exception processing necessitating the reading of data beyond the end of the write pad field. The data previously encoded on the disk may not be appropriate for proper exception processing or could result in data sequences on the disk having less than one 0 or more than seven 0's between adjacent 1's. Such data sequences can produce erroneous decoded data during read back.

Accordingly, there exists a need for a system for encoding a data field on a disk in which the controller does not require knowledge of the encoding mechanism to properly write data fields on a disk in a manner appropriate for reading without introducing errors.

SUMMARY OF THE INVENTION

The present invention is an improvement in a system for encoding a data field on a disk during the write gate signal being active. The system has an encoder and a data selection multiplexer for directing data from the controller in the form of 0 and 1 bits to the encoder. The encoder, in response to the user write gate signal becoming active, produces a run length limited (RLL) code in the form of 0 and 1 bits dependent on the data presented by the controller and suitable for writing to the disk. The RLL code has criteria including a coding rate of ⅔ which requires a minimum of one 0 and a maximum of seven 0's between adjacent 1's. The improvement comprises means for ensuring that during user write gate being inactive the encoder produces RLL codes that are free from exceptions and valid for training and write pad fields. Further, the minimization of trailing exceptions minimizes the necessary length of the write pad field. Still further, the ability of the encoder to generate suitable data for the training and write pad fields eliminates any need for storage space in the data buffer for the training and write pad fields.

In an embodiment of the present invention, the means includes a two bit pair generating mechanism injecting a two bit pair into the encoder. Preferably, the generating mechanism generates an two bit pattern which results in an 0 1 0 encoded RLL pattern output from the encoder.

In another embodiment of the present invention, the means is connected to the encoder in a parallel relationship with the data presented by the controller. The means interjects information into the encoder independent of the data presented by the controller in a multiplex fashion where selection is dependent upon the user write gate signal state.

The present invention is further an encoder for receiving a user write gate signal and two bit data pairs from the controller. The controller presents defined data in the form of 0 and 1 bits to the encoder during the user write gate signal being active and undefined or random data during the user write gate signal being inactive. The encoder, in response to the controller data and the user write gate signal being active, produces a run length limited (RLL) code in the form of 0 and 1 bits dependent on the successive two bit data pairs from the controller. The encoder, in response to the controller user write gate signal being inactive, produces a run length limited (RLL) code in the form of 0 and 1 bits independent on the data being presented by the controller. The RLL data has criteria including a coding rate of ⅔ which requires a minimum of one 0 and a maximum of seven 0's between adjacent 1's.

Annotation: The following text appears to be repeated erratically from above, that is why it is deleted entirely and not edited.

DETAILED DESCRIPTION OF THE PREFERRED EMBODIMENTS

Figures 1, 2, 3:
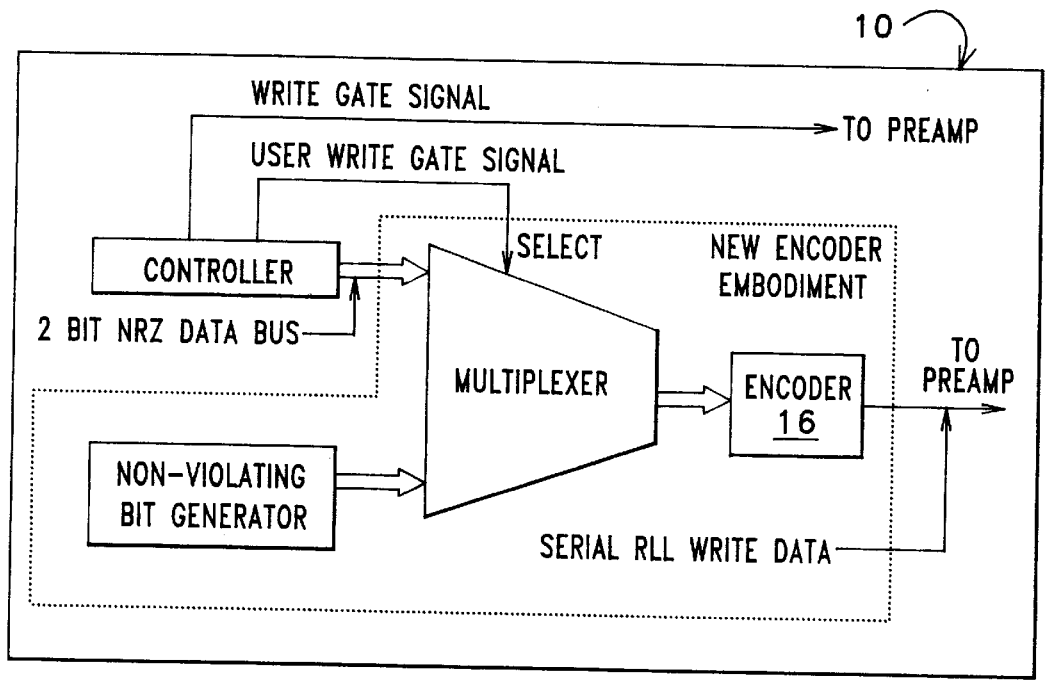
FIG. 1 is a schematic diagram illustrating a magnetic recording encoder system for a (1,7) channel having a ⅔ coding rate constructed in accordance with the present invention.
FIG. 2 is a table illustrating the primary encoding table of the magnetic recording encoder system for a (1,7) channel having a ⅔ coding rate constructed in accordance with the present invention.
FIG. 3 is a table illustrating the secondary encoding table of the magnetic recording encoder system for a (1,7) channel having a ⅔ coding rate constructed in accordance with the present invention.

As illustrated in FIG. 1, the present invention is a system, indicated generally at 10, for encoding a data field 12 on a disk (not shown) during the write gate signal 15 being active. The system 10 has an encoder/decoder 16 (hereinafter referred to as the encoder) and a controller or controlling entity 18 for directing of user data 20 and selection of sub-fields of the written data. The controller 18 directs user data 20, i.e., generally a predetermined number of bytes of data known as non return to zero data (NRZ data), in the form of 0 and 1 bits to the encoder 16. The encoder 16, in response to the NRZ data 20 and the user write gate signal 15 being active, produces a run length limited (RLL) code, also in the form of 0 and 1 bits, dependent on the write gate data 15. As illustrated in FIG. 2, in the present invention, the RLL code preferably has a coding rate of ⅔, where two unconstrained NRZ data bits are mapped into three constrained channel bits, with a primary RLL code criteria requiring a minimum of one 0 and a maximum of seven 0's between adjacent 1's.

An example of the 1,7 constrained ⅔ coding rate as described immediately above, and as illustrated in FIG. 2, will now be discussed. The encoder 16 receives in succession, for example, two bits of information from the controller 18 in the form of 0's and 1's. Each of these pairs are taken in their successive order and translated through a primary look-up table (FIG. 2) 22 from a two bit pair to a three bit word. As discussed above, the constraint of each of the newly formed three bit words is that there can never be two 1's next to each other. These three bit words are then concatenated successively (FIG. 4) to form a binary write data stream. By using three bit words, the possibilities of having two 1's together is greatly lessened (See FIG. 4).

Figures 4, 5:
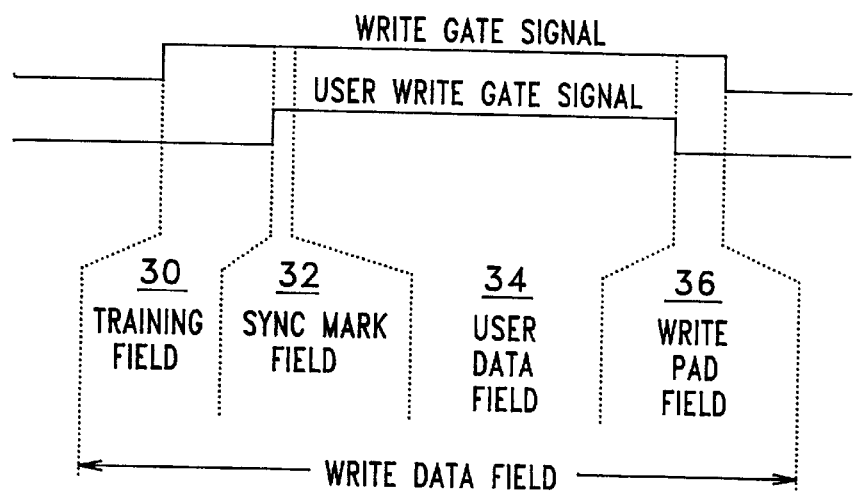
FIG. 4 is representative data, for example, being encoded by both the primary encoding table and the secondary encoding table of the magnetic recording encoder system for a (1,7) channel having a ⅔ coding rate constructed in accordance with the present invention.
FIG. 5 is a schematic diagram illustrating the duration of the actual write of data to the disk of the magnetic recording encoder system for a (1,7) channel having a ⅔ coding rate constructed in accordance with the present invention.

If by chance, by using the two bit pair to three bit word look-up table 22, concatenation causes two 1's together, the encoder 16 produces a secondary coding which violates the (d,k) constraint of the primary RLL code criteria. The encoder 16 detects this and then uses a slightly larger secondary look-up table (FIG. 3) to deal with these exceptions, i.e., four bits to six bits. If the encoder 16 can not meet the primary criteria by translating the two bit pair into a three bit word, then the previous NRZ data bit pair is concatenated with the current NRZ data bit pair producing a four bit word and translated into a six bit word through an secondary look-up table 24. Each of the six bit words generated by the secondary look-up table 24 ends with three 0 bits thus guaranteeing that any subsequent translation and concatenation by the primary look-up table 22 can not generate a violation of the RLL code criteria. Upon the entry of the next two bit NRZ data pair from the controller 18, the encoder 16 begins again with the primary look-up table 22. FIG. 4 illustrates a typical data stream being encoded by both the primary table 22 and the secondary table 24.

For data 12 written on a disk to be accurately read back from the disk the following things, from the point of view of the encoder/decoder 16, must occur;

1) the PLL must adjust to the frequency of the written data 12 and also obtain phase lock with the written data 12;
2) the three bit word boundaries defined during writing the data 12 must be identified and the decoder must synchronize itself with the three bit word boundaries;
3) the start of actual data 12 must be determined;
4) the data 12 must be read in and decoded;
5) ending the read sequence must not generate an error in recovered data.

Knowledge of the foregoing requirements allows one to define the requirements of writing data 12 to the disk. In the present embodiment four distinct fields of information are contained within each section of written data. As illustrated in FIG. 5, these are a training field 30, a sync mark field 32, a user data field 34, and a write pad field 36.

The training field 30 is a repeating pattern of 0 1 0 three bit words. The training field 30 must be long enough for the PLL to obtain phase and frequency lock and then continue in length long enough for the encoder/decoder 16 to identify and synchronize to the 0 1 0 three bit word boundaries as opposed to synchronizing to a 0 0 1 or 1 0 0 pattern. By doing this, the reading requirements of 1) and 2) above are satisfied. It should be noted that with the magnetic recording encoder system 10 of the present invention, the training field 30 is constant for all written data.

The sync mark field 32 is also a known pattern other than the repeated 0 1 0 pattern of the training field 30 and can be generated by any non-repeating two bit pairs. The pattern of the sync mark field 32 is searched for and upon recognition signifies that user data follows immediately. The sync mark field 32 as described above satisfies the reading requirement 3) above.

The user data field 34 is a known number of three bit patterns which represent actual user data. The user data field 34 as described satisfies the reading requirement 4) above and the utility of this invention.

The write pad field 36 is extra data written to the disk, in the form of repeating 010 three bit words, which guarantees that the encoder 16 has completed all exception processing and to overwrite extraneous data present on the disk from the last write operation at this location. The write pad field 36 as described satisfies the reading requirement of 5) above.

The training field 30, the sync mark field 32, and the write pad field 36 are recognized as overhead required for proper reading and writing of data. It is preferable to minimize the size of these fields 30, 32, and 36 thereby yielding greater storage efficiency. The training field 30 and the write pad field 36 are two fields in which the encoder/decoder 16 can have an impact. Further, in having the encoder 16 generate the data for the training field 30 and the write pad field 36, the size of the data buffer can be reduced realizing more efficient use and less required buffer ram for the system.

The system of the present application has a mechanism for ensuring that the last predetermined number of data bits in the data field are free from an exception. Basically, the mechanism forces a non-exception word or two-bit pair which never causes an exception even for any extraneous bits at the end of the write data on the disk thereby guaranteeing to never run into a problem.

In operation, the mechanism is attached in parallel with the controller to the encoder. In other words, the mechanism is independent of the controller. When the user write gate data goes inactive, the mechanism disconnects the controller from the encoder. When the user write gate goes inactive, then the encoder recognizes that it needs to change the multiplexer so that it is always receiving a non-violating bit stream pair.

Once the controller has been disconnected by the encoder, the mechanism directs a non-violating two bit pair, i.e., 0 1, to the encoder. For instance, in the current embodiment of 0 1, the 0 1 two bit pair is preferred since from the primary RLL coding table, the 0 1 two bit pair translates into 0 1 0 which can precede or follow any other encoded constrained three bit symbol without forcing an exception. The mechanism forces the 0 1 two bit pair until a new user write gate is directed to the encoder by the controller. The mechanism forces the end of the data field to be exceptionless, i.e., the last three digits can never be an exception.

In practice, the 0 1 two bit pair is derived logically from a signal supplied by the controller to the mechanism within the encoder. The 0 1 two bit pair is merely being sent to the encoder and are not forced onto the disk. The mechanism interjects independent of the state of the controller data lines in a multiplex fashion the 0 1 signals at the end of the write gate.

The disk drive of the present invention preferably includes a carriage assembly which is described in U.S. patent application Ser. No. 08/965,223-(Attorney Docket No. CAL-P003) filed concurrently herewith and incorporated herein by reference. Furthermore, preferably, the disk 14 of the present invention includes servo sector architecture for a high density, removable media-type disk which is described in U.S. patent application Ser. No. 08/965,111 (Attorney Docket No. CAL-P001) filed concurrently herewith and incorporated herein by reference.

In the magnetic recording encoder system 10 of the present invention, FIG. 1 illustrates the appropriate block diagram of the encoder implementation for generating the above described requirements. Further, this is implemented in an Hardware Description Language (HDL) known as AHDL and is illustrated in Appendix A. The corresponding decoder implementation, also written in AHDL, is illustrated in Appendix B.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

---

APPENDIX A

---

```
-- File: encoder.tdf   Version: 9    Last modified: 10/06/97, 10:52am by JN
--         v9    JN     10/06/97, 10:52am Jim finally figured out how to update a VCS project!?!
--         v8    JN     10/06/97, 10:21am
--         v7    JN     09/30/97, 02:19pm Added debug pins for endec troubleshooting
--         v6    JN     08/28/97, 11:55am vcs maintenance
--         v5    JN     06/27/97, 12:55pm Check-in to new location.
--         v4    JN     08/20/97, 05:23pm
--         v3    JN     08/20/97, 04:44pm Total Rewrite, Implementation through lookup table
--         v1    LWL    08/13/97, 02:36pm Initial Checkin
TITLE "1,7 Encoder";
--================
-- FILENAME:    encoder.tdf
-- LANGUAGE:    ahdl
-- AUTHOR:      Jim Noxon
-- LOCATION:
--
-- DESCRIPTION:
-- This code generates a 1,7 implementation of a channel encoder.
-- Standard mapping of 2 bits to 3 bits is used. The following
-- table indicates the general mapping of the input data;
-- NRZ Data In            Encoded Data Out
         0 0                       0 0 1
         0 1                       0 1 0
         1 0                       1 0 0
         1 1                       1 0 1
-- For those states where a violation would occur the output
```

-- data stream is modified according to the following violation
-- table;
-- NRZ Data In                Encoded Data Out 0 0 1 0                       0 0 1 0 0 0
0 0 1 1                       0 1 0 0 0 0 *
1 1 1 0                       1 0 1 0 0 0
1 1 1 1                       1 0 0 0 0 0 *
    *denotes those violations in which the preceeding symbol is
    translated differently.
-- Implementation of this encoder assumes that the first two
-- bits of nrz data are presented at the time write gate (wg)
-- goes high and then every third read reference clock (rr_clk)
-- thereafter.
-- To minimize the timing problems due to delay from the encoder,
-- a delayed write gate (dly_wg) signal is generated that is
-- synchronized with the data at the write data (wd) output.
General implementation is to use a 2 bit counter (dbtc[]) held
-- in an idle state (dbtc[] == B"11") during times when write gate
-- is held low. When write gate goes high, the counter rolls over
-- and works in a divide by three mode counting from 0 to 1 to 2 and
-- back to 0 again. This provides knowledge of where we are in
-- terms of serializing the output symbol. Write gate is expected
-- to go low after the last nrz pair is clocked in. This causes the
-- counter to count down and underflow into the idle state during
-- output of the last symbol. This methodology allows for simplified
-- mapping of the delayed write gate signal to the state of the
-- counter.
-- Symbol generation is done through a lookup table. The lookup table
-- handles all code violations for the current symbol. For those two
-- symbols that require the modification of the previous symbol, a
-- violation flag (vflag) is set which then modifies the load procedure
-- of the shift register (sr_out[]) such that the previous symbol is
-- corrected before being shifted out.
-- REVISION HISTORY:
--        Date      Person   Description --     11/05/96     ST       Initial creation.
--     03/02/97     dc       Change to different 1,7 endec.
--     08/18/97     JN       Complete revision for new 1,7 encoder
--
-- This media contains an authorized copy or copies of material owned by
-- Caleb Technology. This ownership notice and any other notices included
-- in machine readable copies must be reproduced on all authorized copies.
-- This is confidential and unpublished property of Caleb Technology.
-- All rights reserved.
--=================
INCLUDE "GENERICS.INC"; -- support for modes of compilation
SUBDESIGN encoder
{
rr_clk      : INPUT;        -- read reference clock
resetb      : INPUT;        -- active low reset signal
nrz[1..0]   : INPUT;        -- 2 bit nrz data
wg          : INPUT;        -- write gate
nwd         : OUTPUT;       -- negative serial write data output
last bit    : OUTPUT;       -- represents state of last bit output
dly wg      : OUTPUT;       -- delayed write gate synchronized with serial write data
VARIABLE
sr out[5..0]        : DFF;      -- holds data to be output
dbtc[1..0]          : DFF;      -- holds a divide-by-three-counter
load shift          : SOFT;     -- generates the active high load, active low shift signal
vflag               : SOFT;     -- generates the violation state requiring change of current
output symbol
tb out[1..0][2..0]  : SOFT;     -- generates synbols for output from a translation table
wgff                : DFF;      -- generates the delayed write gate symbol
last                : DFF;      -- holds state of last data bit transfered out
lnrz[1..0]          : SOFT;     -- local nrz data input
BEGIN
-- clock assignments
sr out[].clk = rr_clk;
dbtc[].clk   = rr_clk;
wgff.clk     = rr_clk;
last.clk     = rr_clk;
-- reset assignments
sr out[].clm = resetb;
dbtc[].pm    = resetb;
wgff.clm     = resetb;
last.clm     = resetb;
-- local nrz data implementation
IF wg == VCC THEN -- if writing

```
  lnrz[] = nrz[];  -- get next data
 ELSE             -- if not writing
  lnrz[] = 1;     -- load non violating symbol
 END IF;
-- divide by three counter implementation
IF wg == VCC THEN           -- if writing
 IF dbtc[] == 2 THEN        -- if ready to rollover counter
  dbtc[] = 0;               -- rollover counter
 ELSE                       -- if counting
  dbtc[] = dbtc[] + 1;      -- increment counter
 END IF;
ELSE                        -- if not writing
 IF dbtc[] ? = 3 THEN       -- if not in idle state
  dbtc[] = dbtc[] - 1;      -- decrement counter
 ELSE                       -- if in idle state
  dbtc[] = dbtc[];          -- hold idle state
 END IF;
END IF;
-- load shift implementation
IF dbtc[] == VCC THEN -- if on last count or idle
 load_shift = VCC;          -- should be loading
ELSE                        -- if not on last count and not idle
 load_shift = GND;          -- should be shifting
END IF;
-- delayed write gate implementation
IF wg == VCC THEN -- if writing
 IF wgff == GND THEN -- if initiating a write
  IF dbtc[] == 2 THEN -- if ready for first symbol
   wgff = VCC;              -- delayed write gate becomes true
  ELSE                      -- if not ready for first symbol
   wgff = GND;              -- delayed write gate still false
  END IF;
 ELSE                       -- if in the middle of a write
  wgff = VCC;               -- delayed write gate stays true
 END IF;
ELSE                        -- if not writing
 IF wgff == GND THEN        -- if in between writes
  wgff = GND;               -- delayed write gate stays false
 ELSE                       -- if at end of a write
  IF dbtc[] == 3 THEN       -- if in idle state
   wgff = GND;              -- delayed write gate becomes false
  ELSE                      -- if finishing last symbol.
   wgff = VCC;              -- delayed write gate still true
  END IF;
 END IF;
END IF;
-- the encode translation table
TABLE
```

| lnrz[], | sr_out[4..2] | => | tb_out[1][], | tb_out[0][], | vflag; | |
|---|---|---|---|---|---|---|
| B"00", | B"XXX" | => | B"XXX", | B"001", | GND; | -- 00 can follow anything |
| B"01", | B"XXX" | => | B"XXX", | B"010", | GND; | -- 01 can follow anything |
| B"10", | B"000" | => | B"XXX", | B"100", | GND; | -- data following violations always valid |
| B"10", | B"001" | => | B"XXX", | B"000", | GND; | -- following symbol only violation |
| B"10", | B"010" | => | B"XXX", | B"100", | GND; | -- 10 can follow 01 |
| B"10", | B"011" | => | B"XXX", | B"XXX", | GND; | -- invalid encode, should not occur |
| B"10", | B"100" | => | B"XXX", | B"100", | GND; | -- 10 can follow 10 |
| B"10", | B"101" | => | B"XXX", | B"000", | GND; | -- following symbol only violation |
| B"10", | B"110" | => | B"XXX", | B"XXX", | GND; | -- invalid encode, should not occur |
| B"10", | B"111" | => | B"XXX", | B"XXX", | GND; | -- invalid encode, should not occur |
| B"11", | B"000" | => | B"XXX", | B"101", | GND; | -- data following violations always valid |
| B"11", | B"001" | => | B"010", | B"000", | VCC; | -- following and current symbol violation |
| B"11", | B"010" | => | B"XXX", | B"101", | GND; | -- 11 can follow 01 |
| B"11", | B"011" | => | B"XXX", | B"XXX", | GND; | invalid encode, should not |
| B"11", | B"100" | => | B"XXX", | B"101", | GND; | -- 11 can follow 10 |
| B"11", | B"101" | => | B"100", | B"000", | VCC; | -- foliowing and current symbol violation |
| B"11", | B"110" | => | B"XXX", | B"XXX", | GND; | -- invaiid encode, should not occur |
| B"11", | B"111" | => | B"XXX", | B"XXX", | GND; | -- invalid encode, should not occur |

```
END TABLE;
-- output shift register implementation
```

```
IF load_shift == VCC THEN              -- if loading data
  sr_out[2..0] = tb_out[0][];           -- load next symbol to output
  IF(vflag == VCCY THEN                 -- if in a violation state
    sr_out[5..3] = tb_out[1][];         -- load modified symbol in upper register
  ELSE                                  -- if not in a violation state
    sr_out[5..3] = sr_out[4..2];        -- shift a bit
  END IF;
ELSE                                    -- if not loading data
  sr_out[5..1] = sr_out[4..0];          -- shift a bit
END IF;
last data bit state implementation
IF wgff == VCC THEN                     -- if writing
  last = sr_out[5];                     -- assign last output bit
ELSE                                    -- if not writing
  last = last;                          -- hold iast output bit
END IF;
-- output assignments
nwd      = !sr_out[5];                  -- serial write data output
dly_wg   = wgff;                        -- delayed write gate output
last bit  = last;                       -- last bit output
END;
-- File: decoder.tdf    Version: 4    Last modified: 10/06/97, 10:52am by JN
--       v4  JN    10/06/97, 10:52am   Jim finally figured out how to update a VCS project!?!
--       v3  JN    08/29/97, 02:08pm   Added psuedo sync detect signal to pin 7 of project.
--       v2  JN    08/28/97, 11:01am   New Decoder Initial Check In
--       v1  JN    08/27/97, 01:00pm   Initial checkin
TITLE "1,7 Decoder";
--==============
-- FILENAME:    decoder.tdf
-- LANGUAGE:    ahdl
-- AUTHOR:      Jim Noxon
-- LOCATION:
DESCRIPTION:
-- This file implements a 1,7 decoder with internal synchronization
-- to the tribit boundaries. A signal "locked" is provided to indicate
-- that the decoder is iocked to the tribit boundaries. The input word
-- lock_len allows for a variable length of valid tribit boundaries to
-- be validated before the locked signal is asserted.
-- Implementation is through the use of a look up table which defines
-- the decode map used in the encoder. As read data bits are shifted in
-- they are added to the previous data bits read to generate a look up
-- address for the look up table. When a violation code is read in that
-- requires modification of the previous symbol for proper decoding, a
-- vflag signal is asserted to modify the normal operation of the input
-- data shift register pipeline allowing the symbol to be corrected.
-- Synchronization is accomplished through the use of a divide by three
-- counter and a flip flop indicating lock. The lock flip flop is cleared
-- any time that read gate (rg) is low. Read gate going high enables the
-- lock up logic to take control. While lock is low, the divide by three
-- counter (dbtc[]) is synchronized to each incomming 1 bit. If the
-- synchronization has caused an adjustment in the value of the divide by
-- three counter, the lock counter (lock_cntr[]) is reset to 0. If the
-- synchronization is valid, the lock counter is incremented. Once the
-- lock counter increments to the value on the lock ien input word
-- synchronization is assumed locked and the lock flip flop is asserted.
-- The lock flip fiop reinains in the locked state until read gate is
-- brought low.
-- A signal named sym_err is generated through the use of the look up
-- table. This signal indicates that an invalid symbol combination has
-- occured even though this error inay not violate the 1,7 code constraint.
-- One possible example of this is . . . 001 000 000 100 . . .
-- Clearly there is no 1,7 code vioiation here but this sequence can not
-- legally occur since the symbol stream 000 000 has no corrosponding
-- decode stream.
-- REVISION HISTORY:
--      Date            Person    Description --      08/25/97        JN        Initial attempt at a Decoder
-- This media contains an authorized copy or copies of material owned by
-- Caleb Technology. This ownership notice and any other notices inciuded
-- in machine readable copies must be reproduced on all authorized copies.
-- This is confidentiai and unpublished property of Caleb Technology.
-- All rights reserved.
--
--==============
INCLUDE "GENERICS.INC"; -- support for modes of compilation
SUBDESIGN decoder
{
rr_clk                        : INPUT; -- read reference clock
rd                            : INPUT; -- read data in
```

-continued

```
resetb                    : INPUT; -- system reset
rg                        : INPUT; -- read gate
lock_len[5..0]            : INPUT; -- number of vaiid tribit frames to justify lock on sync field
pattern
nrz[1..0]                 : OUTPUT; -- nrzdata out
sym_err                   : OUTPUT; -- symbol in violation of encode scheme
rd_clk                    : OUTPUT; -- read data clock synchronized with read data
locked                    : OUTPUT; -- indicates decoder is locked to sync field pattern
psync_det                 : OUTPUT; -- psuedo sync detect
VARIABLE
dbtc[1..0]                : DFF; -- divide by three counter
cur_sym[4..0]             : DFF; -- holds input data and output nrz data
cur_nrz[1..0]             : DFF; -- holds currently translated nrz data
prev_nrz[1..0]            : DFF; -- holds output nrz data
err                       : DFF; -- holds symbol in error data
iock                      : DFF; -- identifeds if state counter locked to sync field pattern
iock_cntr[5..0]           : DFF; -- counts vaiid tribit frames during sync field pattern
prev_tbi[1..0]            : NODE; -- generates the corrected previous rirz data bit pair
cur_tbi[1..0]             : NODE; -- generates the current nrz data bit pair
tbl_input[5..0]           : NODE; -- generates the numeric input for the look up table
vflag                     : NODE; -- generates the violation flag
tbl_err                   : NODE; -- generates the symbol error status flag
IF DEBUG CIRCUITRY != 0 GENERATE
psync_det_ff              : DFF; -- holds psuedo sync detect status
END GENERATE;
BEGIN
-- clock assigrunents
dbtc[].clk                = rr_clk;
cur_sym[].clk             = rr_clk;
cur_nrz[].clk             = rr_clk;
prev_nrz[].clk            = rr_clk;
err.clk                   = rr_clk;
lock.clk                  = rr_clk;
lock_cntr[].clk           = rr_clk;
-- reset assignments
dbtc[ .clrn               = resetb;
cur_sym[].clrn            = resetb;
cur_nrz[].clrn            = resetb;
prev_nrz[].clrn           = resetb;
err.clrn                  = resetb;
lock.clrn                 = resetb;
lock_cntr[].clrn          = resetb;
-- lock to sync pattern implementation
IF rg == GND THEN -- if not reading
  lock = GND;
ELSE -- if reading
  IF lock == GND THEN -- if not yet locked up
    IF lock_cntr[] == lock_len[] THEN -- if reached lock count
      lock = VCC; -- indicate that we are locked
    ELSE
      lock = GND; -- indicate that we are not locked
    END IF;
  ELSE -- if already locked up
    lock = VCC; -- hold lock state
  END IF;
END IF;
-- lock counter implementation
IF rg == GND THEN          -- if not reading
  lock_cntr[] = 0;         -- hold counter in ready state
ELSE                       -- if reading
  IF rd == VCC THEN        -- if a one bit in the read data
    IF dbtc[] == 1 THEN    -- if it is synchronous with state counter
      lock_cntr[] = lock_cntr[]+ 1;  -- increment the counter
    ELSE                   -- if not synchrouous iwth state counter
      lock_cntr[] = 0;     -- reset the counter
    END IF;
  ELSE                     -- if not a one bit in the read data
    IF dbtc[]! = 1 THEN    -- if it is synchronous with state counter
      lock_cntr[] = lock_cntr[];  -- hold current count value
    ELSE                   -- if it is not synchronous with state counter
      lock_cntr[] = 0;     -- reset the counter
    END IF;
  END IF;
END IF;
-- divide by three counter implementation
IF lock == VCC THEN        -- if locked up to sync field
  IF dbtc[] == 2 THEN      -- if counter at maximum
    dbtc[] = 0;            -- roll over the counter
  ELSE                     -- if counter not at maximum
    dbtc[] = dbtc[] + 1;   -- increment the counter
```

```
-continued

END IF;
ELSE                                          -- if not locked up to sync field
  IF rg == VCC THEN                           -- if reading
    IF rd == VCC THEN                         -- if a one bit in the read data
      dbtc[] = 2;                             -- synchronize state counter
    ELSE                                      -- if not a one bit
      IF dbtc[] = 2 THEN                      -- if counter at maximum
        dbtc[] = 0;                           -- roll over counter
      ELSE                                    -- if counter not at maximum
        dbtc[] = dbtc[] + 1;                  -- increment the counter
      END IF;
    END IF;
  ELSE                                        -- if not reading
    IF dbtc[] == 2 THEN                       -- if counter at maximum
      dbtc[] = 0;                             -- roll over the counter
    ELSE                                      -- if counter not at maximum
      dbtc[] = dbtc[] + 1;                    -- increment the counter
    END IF;
  END IF;
END IF;
-- psuedo sync detect implementation
IF DEBUG_CIRCUITRY != 0 GENERATE
  psync_det_ff.clk = rr_clk;                  -- clock assignment
  IF lock == VCC THEN                         -- if acquired lock
    IF psync_det_ff == GND THEN               -- if psuedo sync not detected yet
      IF dbtc[] == 2 THEN                     -- if on a tribit boundary
        IF cur_sym[2..0] != B"001" THEN       -- if not in training field
          psync_det_ff = VCC;                 -- assert psuedo sync detect
        ELSE                                  -- if in training field
          psync_det_ff = GND;                 -- maintain sync not found status
        END IF;
      END IF;
    ELSE                                      -- if psuedo sync detected
      psync_det ff = VCC;                     -- maintain sync found status
    END IF;
  ELSE                                        -- if not locked and ready to search for psuedo
sync
    psync_det_ff = GND;                       -- prepare for when ready to search
  END IF;
  psync det = psync_det_ff;                   -- assign output
ELSE GENERATE
  psync det = GND;                            -- set default pin state
END GENERATE;
-- input shift register implementation
cur_sym[4..] = cur sym[3..0];                 -- shift up bit
cur_sym[0] = rd;                              -- shift in data bit
-- input data pipeline implementation
IF dbtc[] == 2 THEN                           -- if on a tribit boundary
  IF vflag == VCC THEN                        -- if this is a violation
    prev_nrz[] = prev_tbl[];                  -- correct previous nrz data
  ELSE                                        -- if this is not a violation
    prev_nrz[] = cur_nrz[];                   -- shift up current nrz data
  END IF;
  cur_nrz[] = cur_tbl[] ;                     -- get current nrz data
ELSE                                          -- if not on a tribit boundary
  prev_nrz[] = prev_nrz[];                    -- hold previous nrz data
  cur_nrz[] = cur_nrz[];                      -- hold current nrz data
END IF;
-- symbol error detection implementation
IF dbtc'== 2 THEN                             -- if only tribit boundary
  err = tbl err;                              -- get symbol error status
ELSE                                          -- if not on a tribit bdundary
  err = err;                                  -- maintain current error status
END IF;
--translation table for input pipeline
tbl_input[5..1] = cur_sym[];
tbl_input[0]   = rd;
TABLE
    tbl_input[]    =>    prev_tbl[],    cur_tbl[],    vflag,    tbl_err;
    B"000001"      =>    B"XX",         B"00",        GND,      GND;
    B"000010"      =>    B"XX",         B"01",        GND,      GND;
    B"000100"      =>    B"XX",         B"10",        GND,      GND;
    B"000101"      =>    B"XX",         B"11",        GND,      GND;
    B"001000"      =>    B"XX",         B"10",        GND,      GND;
    B"001001"      =>    B"XX",         B"00",        GND,      GND;
    B"001010"      =>    B"XX",         B"01",        GND,      GND;
    B"010000"      =>    B"00",         B"11",        VCC,      GND;
    B"010001"      =>    B"XX",         B"00",        GND,      GND;
    B"010010"      =>    B"XX",         B"01",        GND,      GND;
    B"010100"      =>    B"XX",         B"10",        GND,      GND;
```

-continued

```
    B"010101"   =>  B"XX",  B"11",  GND,  GND;
    B"100000"   =>  B"11",  B"11",  VCC,  GND;
    B"100001"   =>  B"XX",  B"00",  GND,  GND;
    B"100010"   =>  B"XX",  B"01",  GND,  GND;
    B"100100"   =>  B"XX",  B"10",  GND,  GND;
    B"100101"   =>  B"XX",  B"11",  GND,  GND;
    B"101000"   =>  B"XX",  B"10",  GND,  GND;
    B"101001"   =>  B"XX",  B"00",  GND,  GND;
    B"101010"   =>  B"XX",  B"01",  GND,  GND;
-- invalid symbol combinations
    B"000000"   =>  B"XX",  B"XX",  GND,  VCC;
    B"XXXX11"   =>  B"XX",  B"XX",  GND,  VCC;
    B"XXX11X"   =>  B"XX",  B"XX",  GND,  VCC;
    B"XX11XX"   =>  B"XX",  B"XX",  GND,  VCC;
    B"X11XXX"   =>  B"XX",  B"XX",  GND,  VCC;
    B"11XXXX"   =>  B"XX",  B"XX",  GND,  VCC;
END TABLE;
-- output assignments
nrz[] = prev_nrz[];
sym_err = err;
locked = lock;
rd_clk = dbtc[1];
END;
```

We claim:

1. An encoder for receiving a write gate code from a data receiving controller, the data receiving controller directing write gate data in the form of 0 and 1 bits to the encoder, the encoder in response to the write gate data producing a run length limited (RLL) code in the form of 0 and 1 bits dependent on the write gate data and directing the RLL code to the disk, the RLL having criteria including a coding rate of 2/3 which requires a minimum of one 0 and a maximum of seven 0's between adjacent 1's, the encoder producing a secondary coding rate as an exception when the write gate data does not result in the RLL code criteria, the encoder comprising:

a multiplexer that, in response to a signal, selects the source of data for encoding from one of the data receiving controller and a second source;

means for converting the data provided by the source selected by the multiplexer into a RLL code.

2. The encoder of claim 1 wherein said second source includes a two bit pair generating mechanism for injecting a two bit pair into said means for converting.

3. The encoder of claim 2 wherein said two bit pair generating mechanism is a 0 1 generator for generating a 0 1 two bit pair.

4. In a system for encoding a data field on a disk with a write gate data, the system having an encoder and a data receiving controller for directing write gate data in the form of 0 and 1 bits to the encoder, the encoder in response to the write gate data producing a run length limited (RLL) code in the form of 0 and 1 bits dependent on the write gate data and directing the RLL code to the disk, the RLL having criteria including a coding rate of 2/3 which requires a minimum of one 0 and a maximum of seven 0's between adjacent 1's, the encoder producing a secondary coding rate as an exception when the write gate data does not result in the RLL code criteria, the improvement comprising:

a multiplexer that, in response to a signal, selects the source of data for encoding from one of the data receiving controller and a second source;

means for converting the data provided by the source selected by the multiplexer into a RLL code.

5. The improvement of claim 4 wherein said second source includes a two bit pair generating mechanism for injecting a two bit pair into said means for converting.

6. The improvement of claim 5 wherein said two bit pair generating mechanism is a 0 1 generator for generating a 01 two bit pair.

7. A method for encoding a data field on a disk with write gate data, the method comprising the steps of:

providing an encoder;

providing a data receiving controller providing write gate data, producing a user write gate signal, and producing a write gate signal;

directing the write gate data in the form of 0 and 1 bits to the encoder when said user write gate signal is in a first state and other data from a source other than the data receiving controller that is in the form of 0 and 1 bits to the encoder when said user write gate signal is in a second state that is different than said first state; and producing a run length limited (RLL) code in the form of 0 and 1 bits from the encoder in response to the write gate data, the RLL code having criteria including a coding rate of 2/3 which requires a minimum of one 0 and a maximum of seven 0's between adjacent 1's.

8. The method of claim 7 wherein said step of directing includes disconnecting the encoder from the controller in response to and at the end of the user write gate signal.

9. The method of claims 7 wherein said step of directing includes connecting the encoder to a means for providing said other data and ensuring that the last predetermined number of bits in the data field are not an exception.

10. The method of claim 9 wherein the means includes a two bit pair generating mechanism for injecting a two bit pair into the encoder.

11. The method of claim 10 wherein said two bit pair generating mechanism is a 0 1 generator for generating a 0 1 two bit pair.

12. In a system for encoding a data field on a disk with a write gate data, the system having an encoder and a data receiving controller for directing write gate data in the form of 0 and 1 bits to the encoder, the encoder in response to the write gate data producing a primary code in the form of 0 and 1 bits and directing the primary code to the disk, the primary code having certain predetermined criteria, the encoder producing a secondary coding rate as an exception when the write gate data does not result in predetermined criteria, the improvement comprising:

a multiplexer that, in response to a signal, selects the source of data for encoding from one of the data receiving controller and a second source;

means for converting the data provided by the source selected by the multiplexer into a primary code.

13. The improvement of claim 12 wherein said second source includes a two bit pair generating mechanism for injecting a two bit pair into said means for converting.

14. The improvement of claim 13 wherein said two bit pair generating mechanism is a 0 1 generator for generating a 0 1 two bit pair.

* * * * *